US009281387B2

(12) United States Patent
Briere

(10) Patent No.: US 9,281,387 B2
(45) Date of Patent: *Mar. 8, 2016

(54) HIGH VOLTAGE DURABILITY III-NITRIDE DEVICE

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/459,726

(22) Filed: Aug. 14, 2014

(65) Prior Publication Data

US 2014/0353723 A1 Dec. 4, 2014

Related U.S. Application Data

(63) Continuation of application No. 13/197,514, filed on Aug. 3, 2011, now Pat. No. 8,809,909, which is a continuation of application No. 12/653,467, filed on Dec. 14, 2009, now Pat. No. 7,999,288, which is a continuation-in-part of application No. 12/324,119, filed on Nov. 26, 2008, now Pat. No. 8,159,003.

(Continued)

(51) Int. Cl.
*H01L 31/0328* (2006.01)
*H01L 31/0336* (2006.01)
(Continued)

(52) U.S. Cl.
CPC ............ *H01L 29/778* (2013.01); *H01L 29/045* (2013.01); *H01L 29/2003* (2013.01); *H01L 29/66462* (2013.01); *H01L 29/7786* (2013.01); *H01L 29/7787* (2013.01)

(58) Field of Classification Search
CPC ...................... H01L 29/66462; H01L 29/7786
See application file for complete search history.

(56) References Cited

U.S. PATENT DOCUMENTS 7,247,889 B2    7/2007  Hanson
7,838,906 B2 *  11/2010 Sato et al. ..................... 257/194
(Continued)

FOREIGN PATENT DOCUMENTS

JP    2003-347523    12/2003
JP    2006351691 A   12/2006
(Continued)

OTHER PUBLICATIONS

Chung, et al: *Seamless On-wafer Integration of GaN HEMTs and Si(100) MOSFETs*, Department of Electrical Engineering and Computer Science, Massachusetts Institute of Technology (2009).

(Continued)

*Primary Examiner* — Howard Weiss
(74) *Attorney, Agent, or Firm* — Farjami & Farjami LLP

(57) ABSTRACT

A high voltage durability III-nitride semiconductor device comprises a support substrate including a first silicon body, an insulator body over the first silicon body, and a second silicon body over the insulator body. The high voltage durability III-nitride semiconductor device further comprises a III-nitride semiconductor body characterized by a majority charge carrier conductivity type, formed over the second silicon body. The second silicon body has a conductivity type opposite the majority charge carrier conductivity type. In one embodiment, the high voltage durability III-nitride semiconductor device is a high electron mobility transistor (HEMT) comprising a support substrate including a <100> silicon layer, an insulator layer over the <100> silicon layer, and a P type conductivity <111> silicon layer over the insulator layer. The high voltage durability HEMT also comprises a III-nitride semiconductor body formed over the P type conductivity <111> silicon layer, the III-nitride semiconductor body forming a heterojunction of the HEMT.

16 Claims, 4 Drawing Sheets

Related U.S. Application Data

(60) Provisional application No. 60/990,142, filed on Nov. 26, 2007.

(51) Int. Cl.
*H01L 31/072* (2012.01)
*H01L 31/109* (2006.01)
*H01L 29/778* (2006.01)
*H01L 29/04* (2006.01)
*H01L 29/20* (2006.01)
*H01L 29/66* (2006.01)

(56) References Cited

U.S. PATENT DOCUMENTS

| 7,999,288 | B2* | 8/2011 | Briere | 257/194 |
|---|---|---|---|---|
| 8,809,909 | B2* | 8/2014 | Briere | 257/194 |
| 2004/0129200 | A1* | 7/2004 | Kouvetakis et al. | 117/2 |
| 2008/0023706 | A1* | 1/2008 | Saito et al. | 257/76 |
| 2008/0112448 | A1 | 5/2008 | Ueda | |
| 2009/0261346 | A1 | 10/2009 | Chen | |
| 2010/0301347 | A1 | 12/2010 | Chung | |

FOREIGN PATENT DOCUMENTS

| JP | 2008153330 A | 7/2008 |
|---|---|---|
| WO | WO2005088687 A1 | 9/2005 |

OTHER PUBLICATIONS

English Translation of Japanese Pre-Appeal Examination Report dated Mar. 11, 15, for Japanese Patent Application 2010-271293.

* cited by examiner

HIGH VOLTAGE DURABILITY III-NITRIDE DEVICE

This is a continuation of application Ser. No. 13/197,514 filed Aug. 3, 2011 now U.S. Pat. No. 8,809,909, which is a continuation of application Ser. No. 12/653,467 filed Dec. 14, 2009, now U.S. Pat. No. 7,999,288, which is a continuation-in-part of, and claims the benefit of and priority to a parent patent application entitled "III-Nitride Wafer and Devices Formed in a III-Nitride Wafer," Ser. No. 12/324,119, filed on Nov. 26, 2008, now U.S. Pat. No. 8,159,003, which in turn claimed the benefit of and priority to U.S. Provisional Application Ser. No. 60/990,142, filed on Nov. 26, 2007. The disclosures in these patent applications are hereby incorporated fully by reference into the present application.

DEFINITION

In the present application, "group III-V semiconductor" refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride" refers to a compound semiconductor that includes nitrogen and at least one group III element such as, but not limited to, GaN, AlGaN, InN, AlN, InGaN, InAlGaN and the like.

BACKGROUND OF THE INVENTION

1. Field of the Invention

The present invention is generally in the field of semiconductors. More specifically, the present invention is in the field of fabrication of compound semiconductors.

2. Background Art

Semiconductor based devices, circuits, and switches employed in various modern applications are often required to display greater power handling capabilities and tolerate higher applied voltages than ever before. One response to these increased device performance demands has been the development and implementation of III-nitride semiconductor devices, such as high electron mobility transistors (HEMTs). In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

In practice, the ability of a HEMT, or any III-nitride semiconductor device, to perform reliably in the face of a high applied voltage (e.g. voltage greater than 600 volts), depends in part on the charge retention characteristics of the 2DEG or other type of conduction channel. In particular, where charge carriers are insufficiently constrained from dispersing out of a desired conduction zone, for example by movement into a silicon substrate of the device, device performance may be less than optimal. More seriously, under applied voltages of even a few hundred volts, a HEMT may short through its silicon substrate, resulting in device failure. Unfortunately, conventional approaches to III-nitride semiconductor device fabrication have failed to provide optimal charge carrier constraint within the conduction zone when high voltage is applied.

Thus, there is a need to overcome the drawbacks and deficiencies in the art by providing a III-nitride semiconductor device, such as a HEMT, exhibiting high voltage durability. It would be of additional advantage if the proposed solution were to provide an implementation capable of supporting monolithic vertical integration of III-nitride power semiconductor devices and silicon devices.

SUMMARY OF THE INVENTION

A high voltage durability III-nitride semiconductor device, substantially as shown in and/or described in connection with at least one of the figures, as set forth more completely in the claims.

DETAILED DESCRIPTION OF THE INVENTION

Figure 1:
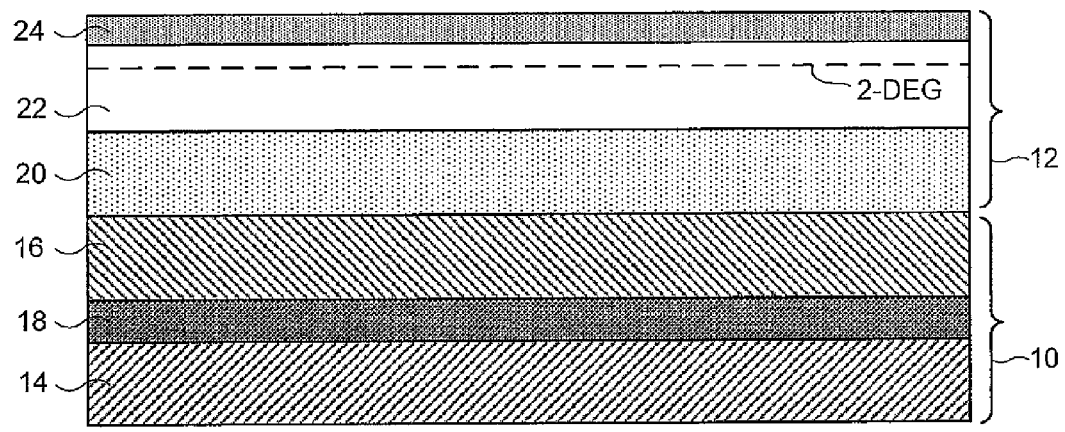
FIG. 1 shows a cross-sectional view of a semiconductor wafer, according to one embodiment of the present invention.

The present invention is directed to a high durability III-nitride semiconductor device. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1 shows a cross-sectional view of a semiconductor wafer, according to one embodiment of the present invention. FIG. 1 shows support substrate 10 and III-nitride semiconductor body 12 formed over support substrate 10. According to the embodiment of FIG. 1, support substrate 10 comprises first silicon body 14, insulator body 18 over first silicon body 14, and second silicon body 16 over insulator body 18. As further shown by FIG. 1, III-nitride semiconductor body 12 comprises III-nitride buffer layer 20, first III-nitride layer 22, and second III-nitride layer 24.

First silicon body 14 may comprise a <100> single crystal silicon, and second silicon body 16 may comprise a <111> single crystal silicon, for example. Alternatively, both of first silicon body 14 and second silicon body 16 may comprise <111> silicon. In either instance, insulator body 18 may be silicon dioxide, for example, and may be implemented so as to electrically isolate first silicon body 14 from second silicon body 16. It is noted that in some embodiments, second silicon body 16 may comprise an epitaxially grown silicon layer.

In embodiments in which first silicon body 14 comprises <100> silicon and second silicon body 16 comprises <111> silicon, as well in those in which both of first silicon body 14 and second silicon body 16 have the same silicon crystal orientation, a silicon on insulator (SOI) substrate may be utilized. A SOI substrate typically includes two silicon substrate layers bonded to one another by an insulator layer. Alternatively, embodiments in which both of first silicon body 14 and second silicon body 16 comprise silicon having the same crystal orientation, such as <111>, may be implemented using a Separation-by-Implanted-Oxygen (SIMOX) process. For example, implantation of oxygen into a <111> silicon substrate followed by an annealing step would result in insulator body 18 being formed between first silicon body 14 and second silicon body 16, as shown in FIG. 1. Insulator body 18 may have a thickness in the range of 0.1 microns to 2.0 microns, for example, such as a thickness of 0.5 microns.

III-nitride semiconductor body 12 may be characterized by its majority charge carrier conductivity type. For example, as represented in FIG. 1, where III-nitride semiconductor body 12 comprises a high electron mobility transistor (HEMT), III-nitride semiconductor body 12 may be characterized by the N type conductivity of the majority charge carriers (electrons) populating its two-dimensional electron gas (2DEG). Similarly, in another embodiment, III-nitride semiconductor body 12 may comprise an n-channel metal-oxide-semiconductor field-effect transistor (NMOS) device and be characterized by its N type conductivity majority charge carriers (electrons). Analogously, where III-nitride semiconductor body 12 comprises a p-channel metal-oxide-semiconductor field-effect transistor (PMOS) device, III-nitride semiconductor body 12 may be characterized by the P type conductivity of its majority charge carriers (holes).

As shown by FIG. 1, for example, in one embodiment, III-nitride semiconductor body 12 may be implemented to comprise such a HEMT. According to that embodiment, III-nitride buffer layer 20 may comprise aluminum nitride (AlN), for example. In addition, respective first and second III nitride layers 22 and 24 may comprise different III-nitride alloys selected so as to produce a 2DEG near the heterojunction formed at their interface. For example, III-nitride semiconductor body 12 may comprise a heterojunction formed at the interface of first III-nitride layer 22 comprising gallium, nitride (GaN) and second III-nitride layer 24 comprising aluminum gallium nitride (AlGaN), where first III-nitride layer 22 is formed over second silicon body 16, and second III-nitride layer 24 is formed over first III-nitride layer 22. More generally, as set forth in the definition section above, first III-nitride layer 22 and second III-nitride layer 24 may correspond to any suitable combination of one or more group III elements and nitrogen.

Figure 2:
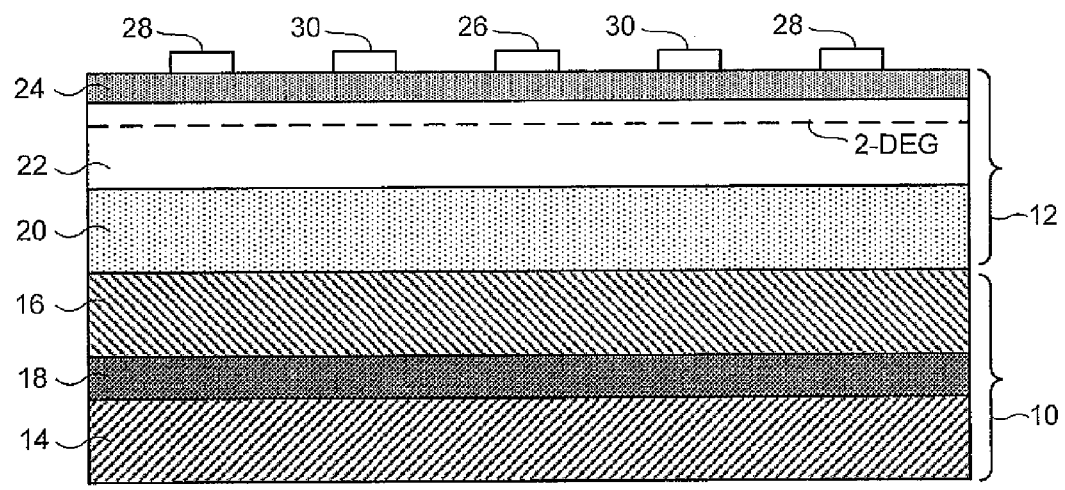
FIG. 2 shows a cross-sectional view of a high voltage durability III-nitride semiconductor device, according to one embodiment of the present invention.

Turning to FIG. 2, FIG. 2 shows a cross-sectional view of a high voltage durability III-nitride semiconductor device, according to one embodiment of the present invention. The device shown by FIG. 2 may correspond to implementation of III-nitride semiconductor body 12 so as to comprise a HEMT, as described in relation to FIG. 1. As shown in FIG. 2, such a device may include first and second power electrodes 26 and 28 (e.g., source and drain electrodes) coupled to the 2DEG through second III-nitride layer 24, and gates 30 situated between respective first and second power electrodes 26 and 28. A gate, such as gate 30, may include an insulated gate electrode or a gate electrode that makes a Schottky contact to second III-nitride layer 24, for example.

The 2DEG represented in FIGS. 1 and 2 corresponds to a very thin conduction channel populated by highly mobile and highly concentrated electrons that are free to move in the two dimensions of the 2DEG, but, ideally, are constrained from movement in a third dimension perpendicular to the 2DEG, for example, into second silicon body 16. In practice, however, application of a few hundred volts to, for example, first power electrode 26, may cause substantial charge leakage through and across second silicon body 16, producing a short between first power electrode 26 and second power electrode 28 through the substrate provided by second silicon body 16, thereby resulting in breakdown of the device.

As described herein, a III-nitride semiconductor device may be adapted as a high voltage durability device by ensuring that second silicon body 16 has a conductivity type opposite the majority charge carrier conductivity type of III-nitride semiconductor body 12. Thus, in the presence of the 2DEG shown in FIG. 2, providing second silicon body 16 having P type conductivity enhances its resistance to breakdown under high applied voltages (e.g., voltages greater than 600 volts). A device such as that presently described by reference to FIG. 2 can be used for high voltage applications because of the purposeful selection of a conductivity type for second silicon body 16 that is opposite that of the majority charge carrier conductivity type of III-nitride semiconductor body 12. In some embodiments, for instance, such a high voltage durability semiconductor device may exhibit a breakdown voltage exceeding 800 volts, and in some embodiments, breakdown may be avoided up to approximately 1200 volts.

In one embodiment, an SOI substrate may be used in which second silicon body 16 may be doped with P type dopants. For example, second silicon body 16 may be P++ doped, and III-nitride semiconductor body 12 capable of producing the 2DEG may be formed over second silicon body 16. Alternatively, a P type silicon body may be epitaxially grown over second silicon body 16, and III-nitride semiconductor body 12 may be formed over the P type epitaxial region.

In another embodiment, one side of a first silicon substrate may be implanted with P type dopants, followed by hydrogen implantation close to the final depth of the implanted region. Thereafter, the top surface of the P type region may be oxidized, and a second silicon substrate (e.g., a handle substrate) may be bonded to the oxidized surface. The P type region can be cleaved along the hydrogen implant region, and a III-nitride power semiconductor device can be fabricated over the P type region, which constitutes second silicon body 16. It is noted than when appropriate, such as when III-nitride semiconductor body 12 comprises a device having P type majority charge carriers, second silicon body 16 may be implemented to have N type conductivity, such as by being N++ doped, for example.

In addition to high voltage durability flowing from appropriate conductivity type selection for second silicon body 16, various embodiments of the present invention have the further significant advantage of supporting monolithic vertical integration of one or more silicon devices with III-nitride semiconductor body 12. For example, electrical isolation of first silicon body 14 and second silicon body 16 from one another, provided by insulator body 18, supports implementation of distinct device types using respective first and second silicon bodies 14 and 16 as independent substrates. Use of <111> silicon for second silicon body 16 may advantageously support formation of III-nitride semiconductor body 12 using second silicon body 16 as a substrate, for instance. Concurrent use of <100> silicon for first silicon body 14 may then render first silicon body 14 suitable for use as a substrate for formation of one or more silicon semiconductor devices, such as MOSFETs, on first silicon body 14.

Thus, appropriate selection of silicon crystal orientations for respective first and second silicon bodies 14 and 16 can render support substrate 10 capable of concurrently supporting operation of III-nitride power semiconductor devices, and lower power silicon devices. Depending upon the desired implementation, first silicon body 14 may be N– doped, N++ doped, P– doped, or P++ doped, for example.

Figure 3:
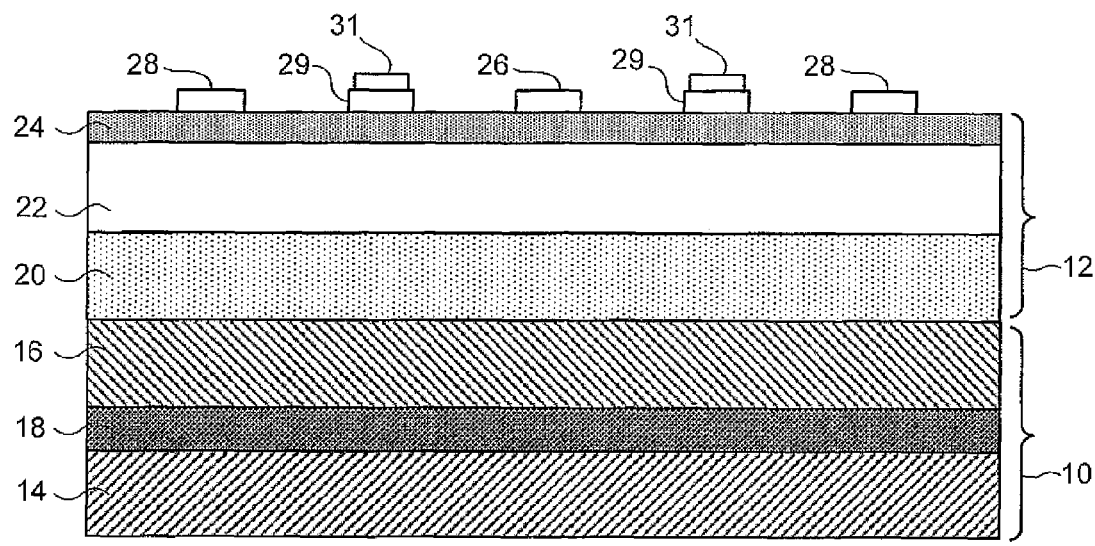
FIG. 3 shows a cross-sectional view of a high voltage durability III-nitride semiconductor device including an insulated gate, according to one embodiment of the present invention.

Referring now to FIG. 3, FIG. 3 shows a cross-sectional view of a high voltage durability III-nitride semiconductor device including an insulated gate, according to one embodiment of the present invention. FIG. 3 shows gates comprising gate dielectric 29 (e.g. silicon dioxide or silicon nitride) situated between gate electrode 31 and second III-nitride layer 24.

Figure 4:
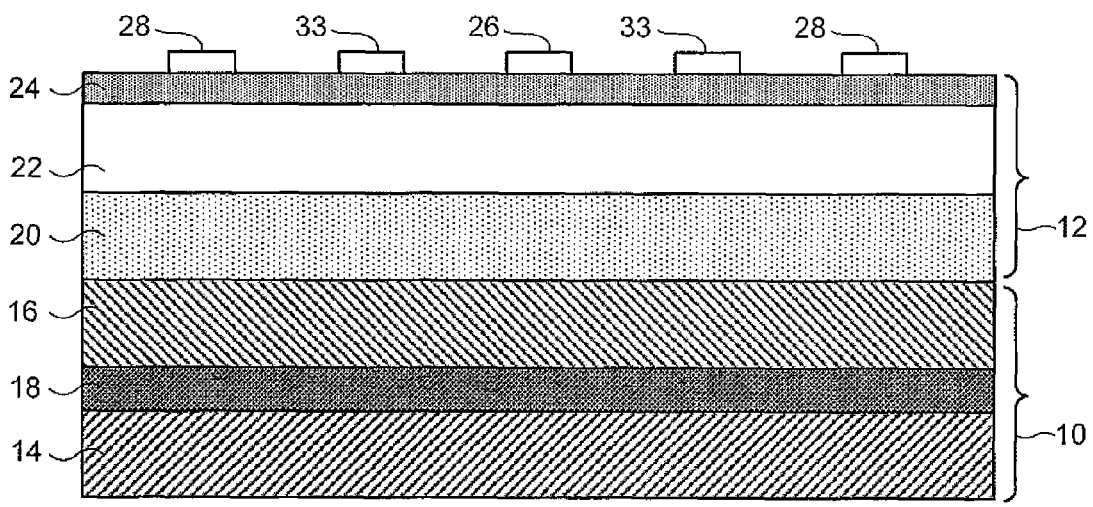
FIG. 4 shows a cross-sectional view of a high voltage durability III-nitride semiconductor device including a Schottky gate, according to one embodiment of the present invention.

FIG. 4 shows a cross-sectional view of a high voltage durability III-nitride semiconductor device including a Schottky gate, according to one embodiment of the present invention. As shown in FIG. 4, in this latter embodiment, gate electrode 33 may be configured to make Schottky contact with second III-nitride layer 24.

Figure 5:
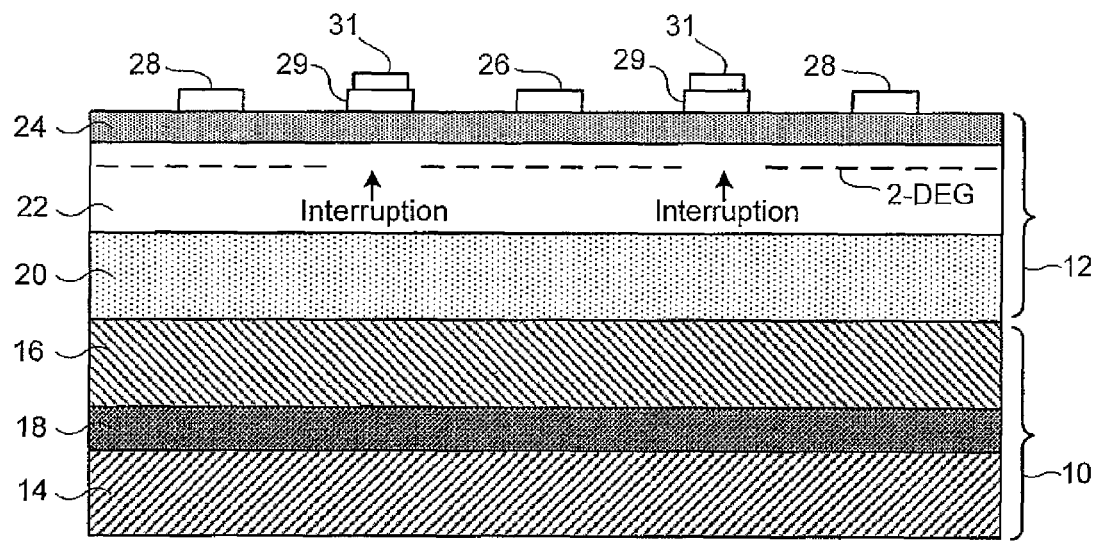
FIG. 5 shows a cross-sectional view of an enhancement mode high voltage durability III-nitride semiconductor device including an insulated gate, according to one embodiment of the present invention.
Figure 6:
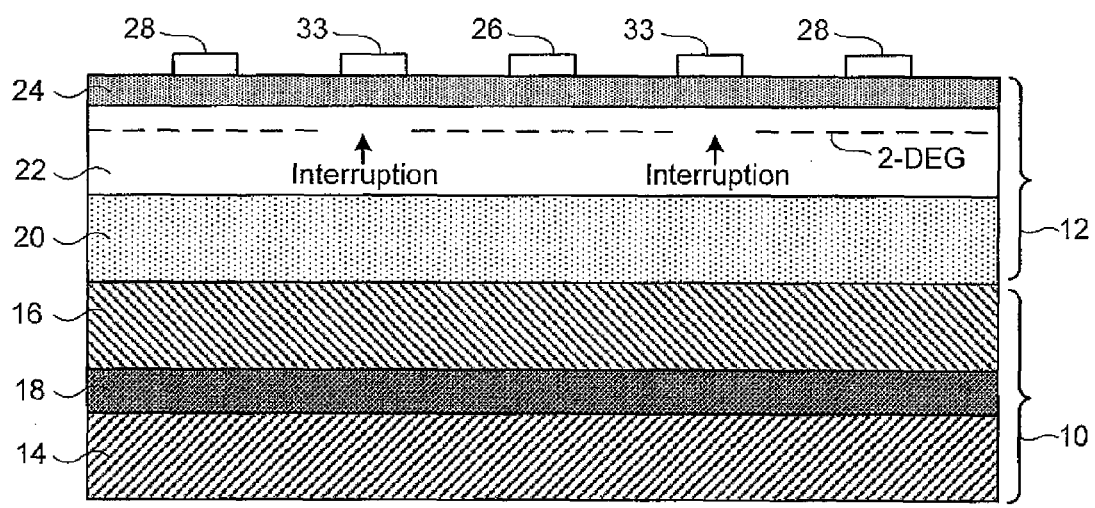
FIG. 6 shows a cross-sectional view of an enhancement mode high voltage durability III-nitride semiconductor device including a Schottky gate, according to one embodiment of the present invention.

Moreover, a high voltage durability III-nitride power semiconductor device may be an enhancement mode device (e.g., normally OFF when no gate voltage is applied to the gate electrode), or a depletion mode device (e.g., normally ON when no gate voltage is applied to the gate electrode). FIG. 5 shows a cross-sectional view of an enhancement mode high voltage durability III-nitride semiconductor device including an insulated gate, while FIG. 6 shows a cross-sectional view of an enhancement mode high voltage durability III-nitride semiconductor device including a Schottky gate, according to embodiments of the present invention. As shown in FIGS. 5 and 6, such enhancement mode devices may have an interrupted 2DEG directly under the gate which can be restored to allow for current conduction upon application of an appropriate voltage (threshold voltage). Examples of various enhancement mode III-nitride power semiconductor devices can be found in U.S. Patent Application Publication No. 2006/0060871, which is commonly assigned to the assignee of the present application.

Figure 7:
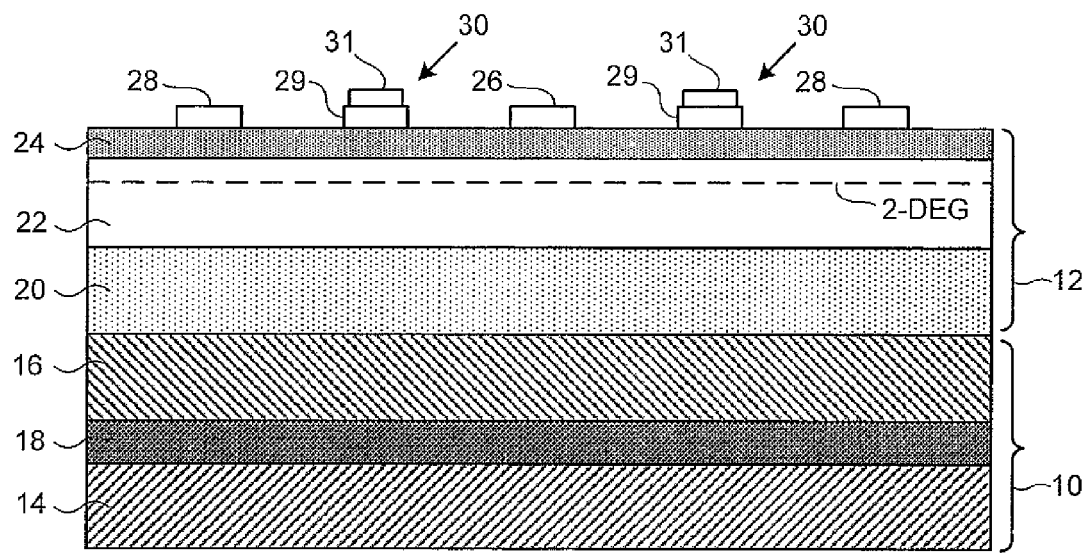
FIG. 7 shows a cross-sectional view of a depletion mode high voltage durability III-nitride semiconductor device including an insulated gate, according to one embodiment of the present invention.
Figure 8:
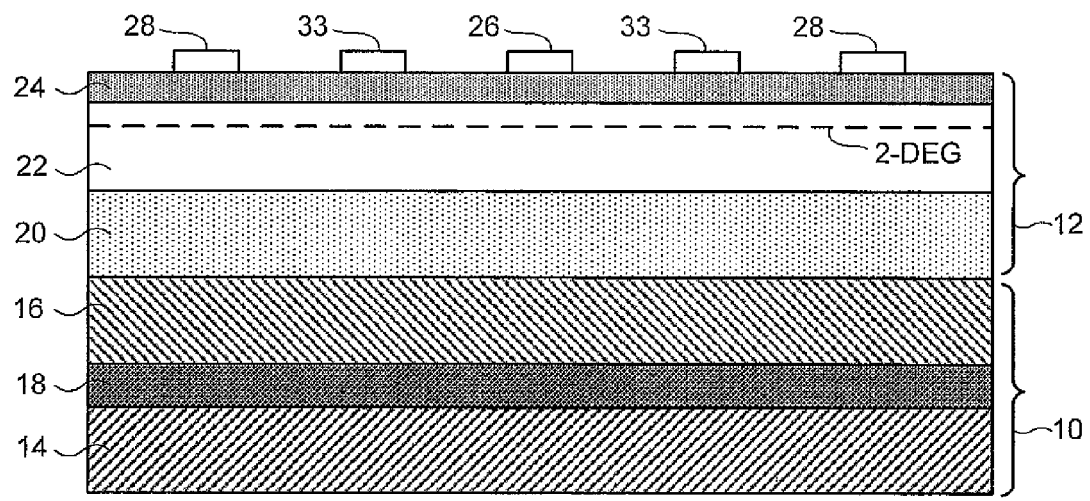
FIG. 8 shows a cross-sectional view of a depletion mode high voltage durability III-nitride semiconductor device including a Schottky gate, according to one embodiment of the present invention.

FIG. 7 shows a cross-sectional view of a depletion mode high voltage durability III-nitride semiconductor device including an insulated gate, while FIG. 8 shows a cross-sectional view of a depletion mode high voltage durability III-nitride semiconductor device including a Schottky gate, according to embodiments of the present invention. As shown in FIGS. 7 and 8, such depletion mode devices may have an uninterrupted 2DEG directly under the gate which can be interrupted to prevent current conduction upon application of a threshold voltage. An Example of a depletion mode III-nitride power semiconductor device is disclosed by U.S. Pat. No. 5,192,987 to Khan et al.

Thus, any of the III-nitride semiconductor structures shown by FIG. 1 through FIG. 8 may be implemented as a high voltage durability semiconductor structure by ensuring that second silicon body 16 has a conductivity type opposite that of type of the majority charge carriers of III-nitride semiconductor body 12. In addition, by utilizing <100> silicon for first silicon body 14, support substrate 10 may be utilized to achieve monolithic vertical integration of one or more silicon semiconductor devices with one or more III-nitride power semiconductor devices.

From the above description of the invention it is manifest that various techniques can be used for implementing the concepts of the present invention without departing from its scope. Moreover while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high voltage durability III-Nitride semiconductor device comprising:
   a P-type silicon body formed over an insulator body, said insulator body formed over an N-type silicon body or over another P-type silicon body;
   an N-type channel formed within a III-Nitride semiconductor body, said III-Nitride semiconductor body formed over said P-type silicon body;
   power electrodes formed over said III-Nitride semiconductor body, and a gate situated between said power electrodes;
   wherein said P-type silicon body increases a breakdown voltage of said high voltage durability III-Nitride transistor.

2. The high voltage durability III-Nitride semiconductor device of claim 1 further comprising a silicon semiconductor device formed on said P-type silicon body.

3. The high voltage durability III-Nitride semiconductor device of claim 2, wherein said silicon semiconductor device comprises a metal-oxide-semiconductor field-effect transistor (MOSFET).

4. The high voltage durability III-Nitride semiconductor device of claim 1 further comprising a plurality of silicon semiconductor devices formed on said P-type silicon body.

5. The high voltage durability III-Nitride semiconductor device of claim 4, wherein said plurality of silicon semiconductor devices comprises a plurality of metal-oxide-semiconductor field-effect transistors (MOSFETs).

6. The high voltage durability III-Nitride semiconductor device of claim 1, wherein said III-Nitride semiconductor body comprises an n-channel metal-oxide-semiconductor field-effect transistor (NMOS) device.

7. The high voltage durability III-Nitride semiconductor device of claim 1, wherein said III-Nitride semiconductor body comprises a plurality of n-channel metal-oxide-semiconductor field-effect transistor (NMOS) devices.

8. A high voltage durability III-nitride semiconductor device comprising:

a support substrate including a first doped silicon body, an insulator body over said first doped silicon body, and a second doped silicon body over said insulator body;

a III-nitride semiconductor body formed over said second silicon body;

an N-type channel formed within a III-Nitride semiconductor body;

power electrodes formed over said III-Nitride semiconductor body, and a gate situated between said power electrodes;

wherein said support substrate increases a breakdown voltage of said high voltage durability III-Nitride transistor.

9. The high voltage durability III-nitride semiconductor device of claim 8 further comprising a silicon semiconductor device formed in said support substrate.

10. The high voltage durability III-nitride semiconductor device of claim 8 further comprising a silicon semiconductor device formed on said first doped silicon body.

11. The high voltage durability III-Nitride semiconductor device of claim 10, wherein said silicon semiconductor device comprises a metal-oxide-semiconductor field-effect transistor (MOSFET).

12. The high voltage durability III-Nitride semiconductor device of claim 8 further comprising a plurality of silicon semiconductor devices formed in said support substrate.

13. The high voltage durability III-Nitride semiconductor device of claim 8 further comprising a plurality of silicon semiconductor devices formed on said first doped silicon body.

14. The high voltage durability III-Nitride semiconductor device of claim 13, wherein said plurality of silicon semiconductor devices comprises a plurality of metal-oxide-semiconductor field-effect transistors (MOSFETs).

15. The high voltage durability III-Nitride semiconductor device of claim 8, wherein said III-Nitride semiconductor body comprises an n-channel metal-oxide-semiconductor field-effect transistor (NMOS) device.

16. The high voltage durability III-Nitride semiconductor device of claim 8, wherein said III-Nitride semiconductor body comprises a plurality of n-channel metal-oxide-semiconductor field-effect transistor (NMOS) devices.

* * * * *